(12) United States Patent
Hayashida et al.

(10) Patent No.: US 8,535,852 B2
(45) Date of Patent: Sep. 17, 2013

(54) HOLOGRAM RECORDING MATERIAL AND HOLOGRAM RECORDING MEDIUM

(75) Inventors: Naoki Hayashida, Tokyo (JP); Kazushi Tanaka, Tokyo (JP); Jiro Yoshinari, Tokyo (JP)

(73) Assignee: TDK Corporation, Tokyo (JP)

( * ) Notice: Subject to any disclaimer, the term of this patent is extended or adjusted under 35 U.S.C. 154(b) by 139 days.

(21) Appl. No.: 13/107,281

(22) Filed: May 13, 2011

(65) Prior Publication Data

US 2011/0287343 A1    Nov. 24, 2011

(30) Foreign Application Priority Data

May 20, 2010    (JP) .................................. 2010-116784

(51) Int. Cl.
*G03H 1/02*    (2006.01)
(52) U.S. Cl.
USPC ........................................ 430/2; 430/1; 359/3
(58) Field of Classification Search
None
See application file for complete search history.

(56) References Cited

U.S. PATENT DOCUMENTS

| | | | | |
|---|---|---|---|---|
| 3,658,526 A | * | 4/1972 | Haugh | 430/1 |
| 4,197,130 A | * | 4/1980 | Nakamura et al. | 430/286.1 |
| 4,942,112 A | * | 7/1990 | Monroe et al. | 430/282.1 |
| 5,147,757 A | * | 9/1992 | Kurtz et al. | 430/270.1 |
| 5,858,614 A | * | 1/1999 | Sato et al. | 430/280.1 |

(Continued)

FOREIGN PATENT DOCUMENTS

JP    2001-282082    10/2001

JP    2006-150722    *  6/2006

(Continued)

*Primary Examiner* — Martin Angebranndt
(74) *Attorney, Agent, or Firm* — Oblon, Spivak, McClelland, Maier & Neustadt, L.L.P.

(57) ABSTRACT

The present invention provides a hologram recording material and a hologram recording medium that can stably maintain the shape of a recording layer and achieve high diffraction efficiency. A hologram recording material comprising a photoradical polymerizable compound (A), a photopolymerization initiator (B), and a dispersion medium (C). The medium (C) is selected from the group consisting of: a compound of the formula (I):

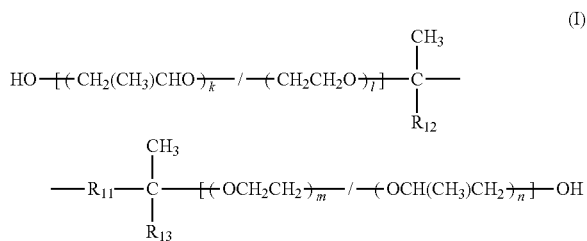

wherein $R_{11}$ is a divalent $C_{2-4}$ hydrocarbon group, $R_{12}$ and $R_{13}$ each independently represent a $C_{1-10}$ hydrocarbon group, k, l, m and n are each independently a number of 0 or more and 5 or less; and a compound of the formula (II):

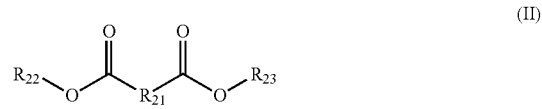

wherein $R_{21}$ represents a divalent $C_{1-6}$ hydrocarbon group, $R_{22}$ and $R_{23}$ each independently represent a $C_{1-12}$ hydrocarbon group, and at least one of $R_{22}$ and $R_{23}$ represents a $C_{5-12}$ hydrocarbon group.

10 Claims, 1 Drawing Sheet

(56) References Cited

U.S. PATENT DOCUMENTS

| | | | |
|---|---|---|---|
| 6,632,852 B1 * | 10/2003 | Chen et al. | 522/79 |
| 7,173,744 B1 * | 2/2007 | Whiteside et al. | 359/3 |
| 7,767,361 B2 | 8/2010 | Mizushima | |
| 7,883,821 B2 | 2/2011 | Kosuda et al. | |
| 7,932,000 B2 | 4/2011 | Hayashida et al. | |
| 7,939,221 B2 | 5/2011 | Kosuda et al. | |
| 2002/0166622 A1 * | 11/2002 | Weder | 156/209 |
| 2003/0096172 A1 * | 5/2003 | Ichihashi et al. | 430/1 |
| 2004/0096776 A1 | 5/2004 | Tanigawa et al. | |
| 2005/0271973 A1 * | 12/2005 | Ziegler et al. | 430/270.1 |
| 2007/0111107 A1 | 5/2007 | Yoshinari et al. | |
| 2007/0111108 A1 | 5/2007 | Hayashida et al. | |
| 2007/0243473 A1 | 10/2007 | Mizushima et al. | |
| 2007/0243474 A1 | 10/2007 | Mizushima et al. | |
| 2007/0279745 A1 * | 12/2007 | Klemann | 359/566 |
| 2008/0057404 A1 | 3/2008 | Kosuda et al. | |
| 2008/0057405 A1 | 3/2008 | Yoshinari et al. | |
| 2008/0076033 A1 | 3/2008 | Hayashida et al. | |
| 2008/0160421 A1 | 7/2008 | Hayashida et al. | |
| 2008/0254375 A1 | 10/2008 | Hayashida et al. | |
| 2008/0268349 A1 | 10/2008 | Kosuda et al. | |
| 2009/0091810 A1 | 4/2009 | Yoshinari et al. | |
| 2009/0092904 A1 | 4/2009 | Hayashida et al. | |
| 2009/0097085 A1 | 4/2009 | Hayashida et al. | |
| 2009/0186281 A1 | 7/2009 | Kosuda et al. | |
| 2010/0086859 A1 | 4/2010 | Hayashida et al. | |
| 2010/0086861 A1 * | 4/2010 | Weiser et al. | 430/2 |

FOREIGN PATENT DOCUMENTS

| | | | |
|---|---|---|---|
| JP | 4232001 | | 12/2008 |
| JP | 4325404 | | 6/2009 |
| RU | 1371281 | * | 4/1995 |
| WO | WO 03/081344 A1 | | 10/2003 |

* cited by examiner

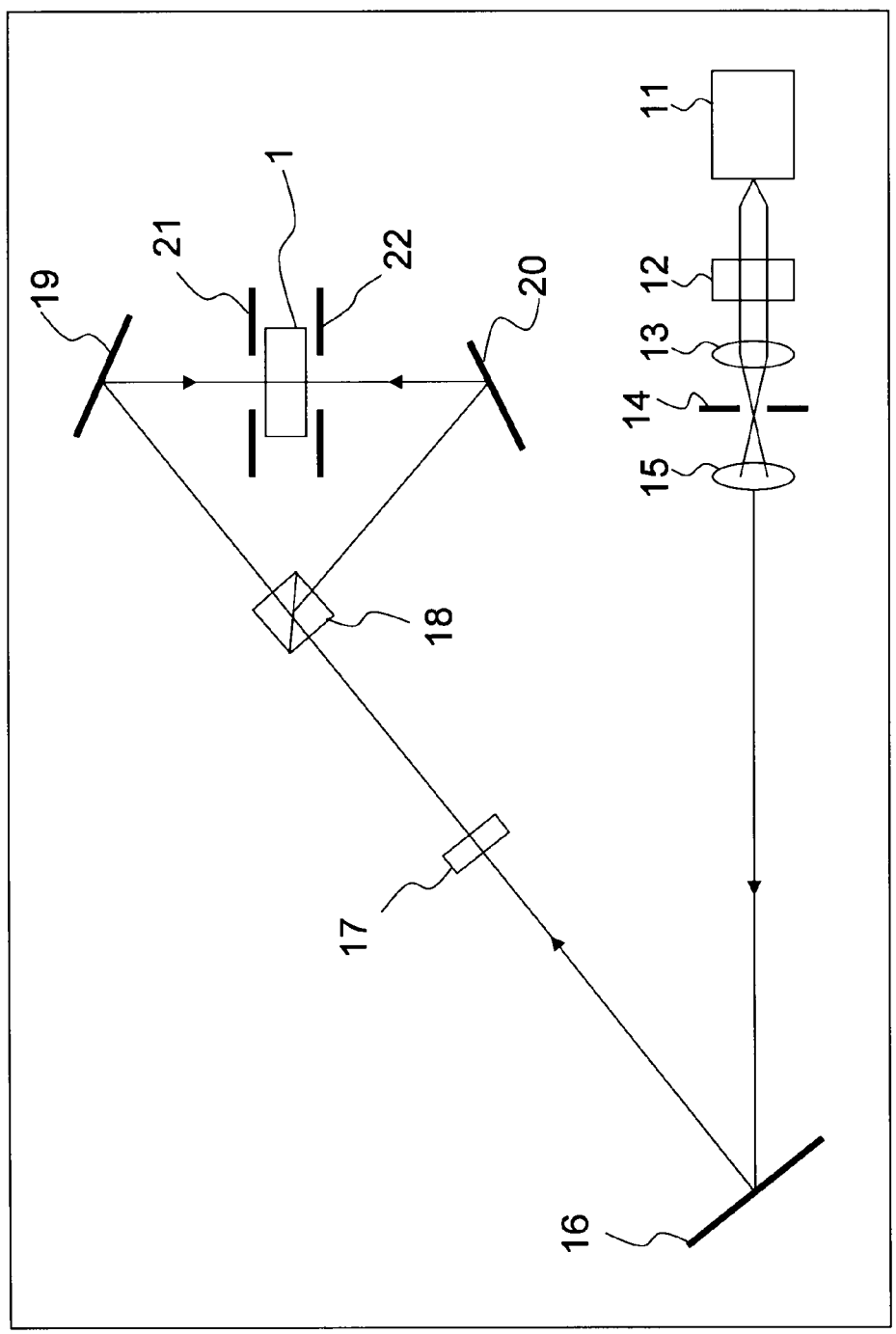

HOLOGRAM RECORDING MATERIAL AND HOLOGRAM RECORDING MEDIUM

BACKGROUND OF THE INVENTION

1. Field of the Invention

The present invention relates to a hologram recording material suitable for volume hologram recording and a hologram recording medium having a hologram recording layer comprising the hologram recording material.

2. Disclosure of the Related Art

Various volume hologram recording materials using photosensitive resins have been proposed, and some of them have been practically used. A photosensitive resin is generally called a "photopolymer". Unlike conventional silver halide photosensitive materials, hologram recording materials using photopolymers are very advantageous in that they do not require development processing.

A typical photopolymer material for hologram recording comprises, for example, a photopolymerizable monomer (a), a binder polymer (b), a plasticizer (c), and a photopolymerization initiator (d). By irradiating a hologram recording material in a layer form made of the photopolymer material with recording light on which an interference pattern is superimposed, the interference pattern is recorded in the recording material as a refractive index difference (refractive index modulation: Δn). The reaction mechanism of the recording material at this time is considered as follows. That is, the photopolymerization initiator (d) is cleaved in bright portion of the interference pattern by exposure, which triggers the polymerization of the photopolymerizable monomer (a) present near the photopolymerization initiator (d). As a result, the concentration of the unreacted monomer is decreased in the bright portion, and therefore a monomer concentration gradient is generated between the bright portion and dark portion. In order to compensate the generated concentration gradient, the unreacted monomer is diffused from the dark portion to the bright portion so that the polymerization reaction of the monomer further proceeds in the bright portion. As a result, a large amount of a polymer of the photopolymerizable monomer (a) is present in the bright portion. At this time, a pattern of the bright and dark portions is recorded as a refractive index modulation (Δn) by previously selecting the respective components (a) to (d) so that a refractive index difference between the photopolymerizable monomer (a) (and its polymer) and the other components becomes large.

The plasticizer (c) is required to promote the diffusion of the photopolymerizable monomer (a) in the hologram recording material. More specifically, it is considered that the diffusion of the monomer (a) is promoted by reducing the viscosity of the hologram recording material. The diffusion of the monomer is proportional to the diffusion coefficient D of the monomer according to the Fick's law, but it is known that the diffusion coefficient D is proportional to the reciprocal of the viscosity η of the system (Stokes-Einstein relation). Therefore, the migration of the monomer at recording can be promoted by adding a large amount of low-viscosity plasticizer to the system to increase the diffusion coefficient D of the monomer. However, in fact, it is difficult to add a large amount of plasticizer. This is because a recording layer having a film thickness of about tens of micrometers to hundreds of micrometers is often used, and therefore it is difficult to maintain the shape of the recording layer when the viscosity of the recording material is extremely reduced due to the addition of a large amount of plasticizer. Further, as the plasticizer, a non-photopolymerizable plasticizer is generally used, and such a plasticizer remains as a liquid in the recording material layer even after recording. Therefore, sealing needs to be properly performed; otherwise there is a fear that a problem such as gradual bleeding out (seeping) of the plasticizer after recording occurs.

For example, Japanese Laid-open Patent Publication No. 2001-282082 discloses a hologram recording material composition comprising an allyl-based prepolymer (A), a radical polymerizable compound (B), a viscosity reducing agent (C), and a photopolymerization initiator (D), and describes that the viscosity reducing agent (C) is a compound (C1) non-reactive with the allyl-based prepolymer (A) and/or the radical polymerizable compound (B), or a compound (C2) having a (meth)allyl group in the molecule (paragraph [0083]). Japanese Laid-open Patent Publication No. 2001-282082 discloses, as examples of the non-reactive viscosity reducing agent (C1), phthalic acid esters typified by dimethyl phthalate and diethyl phthalate; aliphatic dibasic acid esters typified by dimethyl adipate, dibutyl adipate, dimethyl sebacate, and diethyl succinate; acetic acid esters typified by glyceryl triacetate and 2-ethylhexyl acetate; and alkylene glycol alkyl ethers (paragraph [0084]).

Further, Japanese Patent Nos. 4232001 and 4325404 also disclose, as examples of a plasticizer, compounds similar to the above-mentioned non-reactive viscosity reducer (C1) (Japanese Patent No. 4232001, page 7, line 46 to page 8, line 23; Japanese Patent No. 4325404, page 7, line 39 to page 8, line 19).

Patent Document 1: Japanese Laid-open Patent Publication No. 2001-282082
Patent Document 2: Japanese Patent No. 4232001
Patent Document 3: Japanese Patent No. 4325404

SUMMARY OF THE INVENTION

However, the plasticizers disclosed in the above patent documents do not have sufficient action to promote the diffusion of the photopolymerizable monomer at the time of light exposure for recording, and therefore high diffraction efficiency is not achieved. In order to obtain sufficient action to promote the diffusion of the photopolymerizable monomer, it is necessary to reduce the viscosity of the hologram recording material by using a large amount of the plasticizer. However, this causes the above-described adverse effect.

An object of the present invention is to provide a hologram recording material that makes it possible to stably maintain the shape of a recording layer and achieve high diffraction efficiency; and to provide a hologram recording medium having a hologram recording layer comprising the hologram recording material.

The present inventors have extensively studied, and as a result have found that the use of a compound having a specific structure as a dispersion medium for dispersing a radical polymerizable monomer and a photopolymerization initiator makes it possible to obtain sufficient action to promote the diffusion and migration of the photopolymerizable monomer at the time of light exposure for recording without reducing the viscosity of a recording material by using a large amount of a conventional plasticizer, which makes it possible to provide a hologram recording material that achieves the above object.

The present invention includes the followings:

(1) A hologram recording material comprising at least a photoradical polymerizable compound (A), a photopolymerization initiator (B), and a dispersion medium (C) for dispersing the photoradical polymerizable compound (A) and the photopolymerization initiator (B), wherein the photoradical polymerizable compound (A) is a compound having at least one aromatic ring and at least one (meth)acryloyl group in each molecule, and the dispersion medium (C) is selected from the group consisting of:

a compound represented by the general formula (I):

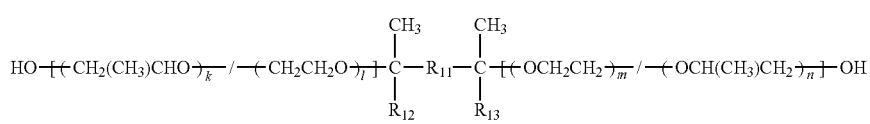

(I)

wherein $R_{11}$ represents a divalent hydrocarbon group having 2 to 4 carbon atoms, $R_{12}$ and $R_{13}$ may be the same or different and each represents a hydrocarbon group having 1 to 10 carbon atoms, l and m represent a number of repeating ethylene oxide units, k and n represent a number of repeating propylene oxide units, provided that k, l, m and n are each independently a number of 0 or more and 5 or less, and the ethylene oxide units and the propylene oxide units may be arranged in a random or block configuration; and a compound represented by the general formula (II):

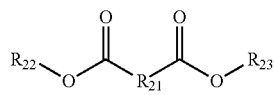

(II)

wherein $R_{21}$ represents a divalent hydrocarbon group having 1 to 6 carbon atoms, $R_{22}$ and $R_{23}$ may be the same or different and each represents a hydrocarbon group having 1 to 12 carbon atoms, and at least one of $R_{22}$ and $R_{23}$ represents a hydrocarbon group having 5 to 12 carbon atoms.

(2) The hologram recording material according to the above-described (1), wherein $R_{11}$ in the general formula (I) is a divalent acetylene unit (—Ca≡C—).

(3) The hologram recording material according to the above-described (1) or (2), wherein $R_{21}$ in the general formula (II) is a divalent chain saturated hydrocarbon group having 1 to 6 carbon atoms or a divalent chain unsaturated hydrocarbon group having 1 to 6 carbon atoms.

(4) The hologram recording material according to any one of the above-described (1) to (3), wherein the photoradical polymerizable compound (A) includes a compound selected from the group consisting of:

a compound represented by the general formula (III):

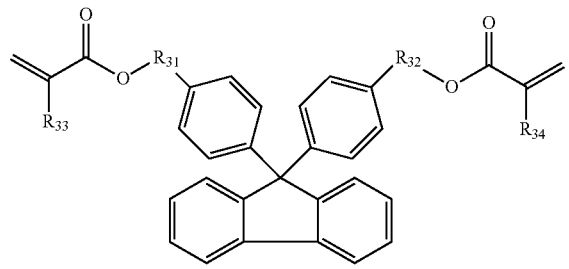

(III)

wherein $R_{31}$ and $R_{32}$ may be the same or different and each represents a (benzene ring)-OCH$_2$CH$_2$— group or a (benzene ring)-OCH$_2$CH(OH)CH$_2$— group, and $R_{33}$ and $R_{34}$ may be the same or different and each represents a hydrogen atom or a methyl group;

a compound represented by the general formula (IV):

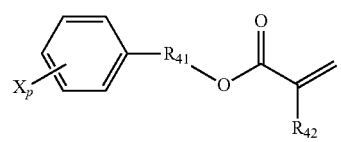

(IV)

wherein $R_{41}$ represents a single bond or a divalent organic group which has 5 or less carbon atoms and may have a heteroatom, $R_{42}$ represents a hydrogen atom or a methyl group, X represents a Cl, Br, or I atom, and p is an integer of 0 to 5;

a compound represented by the general formula (V):

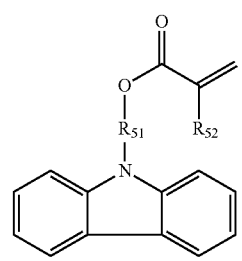

(V)

wherein $R_{51}$ represents a divalent organic group which has 5 or less carbon atoms and may have a heteroatom, and $R_{52}$ represents a hydrogen atom or a methyl group; and a compound represented by the general formula (VI):

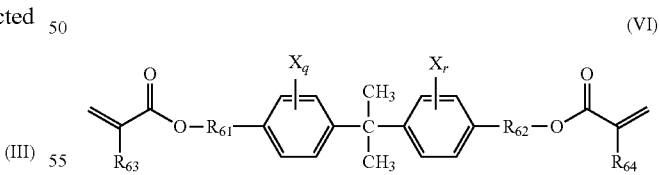

(VI)

wherein $R_{61}$ and $R_{62}$ may be the same or different and each represents a divalent organic group which has 10 or less carbon atoms and may have a heteroatom, $R_{63}$ and $R_{64}$ may be the same or different and each represents a hydrogen atom or a methyl group, X represents a Cl, Br, or I atom, and q and r are each independently an integer of 0 to 4.

(5) The hologram recording material according to any one of the above-described (1) to (4), wherein the photoradical polymerizable compound (A), the photopolymerization initiator (B), and the dispersion medium (C) are blended in a weight ratio of:

10 to 70 parts by weight of the photoradical polymerizable compound (A);

3 to 20 parts by weight of the photopolymerization initiator (B); and 25 to 80 parts by weight of the dispersion medium (C).

(6) The hologram recording material according to any one of the above-described (1) to (4), further comprising a binder polymer (D).

(7) The hologram recording material according to the above-described (6), wherein at least a part of the binder polymer (D) is a (meth)allyl group-containing compound.

(8) The hologram recording material according to the above-described (6) or (7), wherein the photoradical polymerizable compound (A), the photopolymerization initiator (B), the dispersion medium (C), and the binder polymer (D) are blended in a weight ratio of:

10 to 70 parts by weight of the photoradical polymerizable compound (A);

3 to 20 parts by weight of the photopolymerization initiator (B);

5 to 30 parts by weight of the dispersion medium (C); and 20 to 80 parts by weight of the binder polymer (D).

(9) A hologram recording medium for image recording, which comprises:

a substrate, and a hologram recording layer comprising the hologram recording material according to any one of the above-described (1) to (8) formed on the substrate.

The hologram recording material according to the present invention contains, as the dispersion medium (C) for dispersing the photoradical polymerizable compound (A) and the photopolymerization initiator (B), a compound selected from the group consisting of a compound represented by the above general formula (I) and a compound represented by the above general formula (II). This promotes the diffusion and migration of the photoradical polymerizable compound (A) at the time of light exposure for recording so that high diffraction efficiency is achieved. Further, unlike conventional hologram recording materials, it is not necessary to use a large amount of plasticizer, thereby improving the stability of a recording layer.

The reason why the diffusion of the photopolymerizable compound is promoted can be considered as follows.

The compounds for use as the dispersion medium serve as a non-ionic surfactant. That is, the compound represented by the general formula (I) has two OH groups (or polyethylene oxide/polypropylene oxide chains each having an OH group as an end group) as hydrophilic groups, and the two hydrophilic groups are bound together by a hydrocarbon group (—C—$R_{11}$—C—) having a predetermined chain length. The compound represented by the general formula (II) has two ester bonds that act as hydrophilic groups, and the two ester bonds are bound together by a hydrocarbon group (—$R_{21}$—) having a predetermined chain length. It can be considered that since these compounds both have a structure in which two hydrophilic groups are bound by a hydrocarbon group having a predetermined chain length, the diffusion and migration of the photoradical polymerizable compound (A) having an aromatic ring and a (meth)acryloyl group in each molecule are promoted by a steric and polar balance between a hydrophilic group and a hydrophobic group.

Thus, according to the present invention, it is possible to provide a hologram recording material that makes it possible to stably maintain the shape of a recording layer and achieve high diffraction efficiency; and to provide a hologram recording medium having a hologram recording layer comprising the hologram recording material.

BRIEF DESCRIPTION OF THE DRAWINGS

FIG. 1 is a schematic plan view of a hologram recording optical system used in the examples.

DETAILED DESCRIPTION OF THE INVENTION

A hologram recording material according to the present invention is a composition comprising at least a photoradical polymerizable compound (A), a photopolymerization initiator (B), a dispersion medium (C) for dispersing the photoradical polymerizable compound (A) and the photopolymerization initiator (B). A hologram recording medium for image recording according to the present invention comprises a substrate and a hologram recording layer formed on the substrate, the layer comprising the hologram recording material of the present invention. In this specification, the hologram recording layer is sometimes referred to as a "hologram recording material layer".

The photoradical polymerizable compound (A) is a compound having at least one aromatic ring and at least one (meth)acryloyl group in the molecule. The introduction of an aromatic ring into the molecule increases the refractive index of the photoradical polymerizable compound (A). As used herein, the "(meth)acryloyl group" is a collective term for methacryloyl group and acryloyl group.

The photoradical polymerizable compound (A) may be selected from monofunctional or polyfunctional (meth)acrylic acid ester monomers having an aromatic ring in the molecule. Alternatively, the photoradical polymerizable compound (A) may be an oligomer (e.g., a dimer or a trimer) of (meth) acrylic acid ester monomers.

As the photoradical polymerizable compound (A), a compound represented by any one of the following general formulas (III) to (VI) can be used.

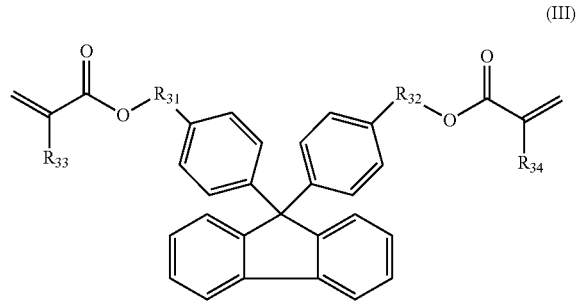

(III)

In the general formula (III), $R_{31}$ and $R_{32}$ may be the same or different and each represents a (benzene ring)-$OCH_2CH_2$— group or a (benzene ring)-$OCH_2CH(OH)CH_2$— group, and $R_{33}$ and $R_{34}$ may be the same or different and each represents a hydrogen atom or a methyl group. A specific example of the compound represented by the general formula (III) is 9,9-bis[4-(2-(meth)acryloyloxyethoxy)phenyl]fluorene.

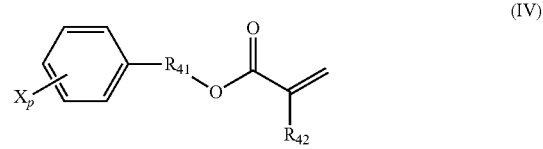

(IV)

In the general formula (IV), $R_{41}$ represents a single bond or a divalent organic group which has 5 or less carbon atoms and may have a heteroatom (e.g., an oxygen or sulfur atom), $R_{42}$ represents a hydrogen atom or a methyl group, X represents a Cl, Br, or I atom, and p is an integer of 0 to 5. The introduction of a halogen atom (Cl, Br, or I) increases the refractive index of the compound.

Specific examples of $R_{41}$ include a single bond, —$CH_2$—, —$CH_2CH_2$—, (benzene ring)-$OCH_2CH_2$—, (benzene ring)-($OCH_2CH_2$)n-, (benzene ring)-($OCH(CH_3)CH_2$)n-, (benzene ring)-$OCH_2CH(OH)CH_2$—, and (benzene ring)—$SCH_2CH_2$—.

Specific examples of the compound represented by the general formula (IV) wherein $R_{41}$ is any one of the above specific examples include 2,4,6-tribromophenyl(meth)acrylate, benzyl(meth)acrylate, phenethyl(meth)acrylate, phenoxyethyl(meth)acrylate, EO-modified phenyl(meth)acrylate, PO-modified phenyl(meth)acrylate, epichlorohydrin (ECH)-modified phenoxy(meth)acrylate, and phenylthioethyl(meth)acrylate.

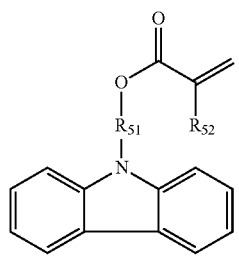

(V)

In the general formula (V), $R_{51}$ represents a divalent organic group which has 5 or less carbon atoms and may have a heteroatom (e.g., an oxygen atom), and $R_{52}$ represents a hydrogen atom or a methyl group. Specific examples of $R_{51}$ include —$CH_2CH_2$— and (N atom of carbazole ring)-$CH_2CH_2$— ($OCH_2CH_2$)n-. A specific example of the compound represented by the general formula (V) is 2-(9-carbazolyl)ethyl(meth)acrylate.

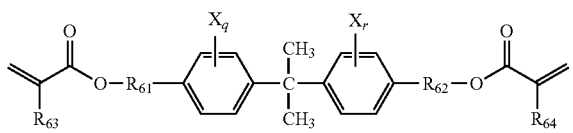

(VI)

In the general formula (VI), $R_{61}$ and $R_{62}$ may be the same or different and each represents a divalent organic group which has 10 or less carbon atoms and may have a heteroatom (e.g., an oxygen or sulfur atom), $R_{63}$ and $R_{64}$ may be the same or different and each represents a hydrogen atom or a methyl group, X represents a Cl, Br, or I atom, and q and r are each independently an integer of 0 to 4. The introduction of a halogen atom (Cl, Br, or I) increases the refractive index of the compound.

Specific examples of $R_{61}$ and $R_{62}$ include —$CH_2$—, —$CH_2CH_2$—, (benzene ring)-$OCH_2CH_2$—, (benzene ring)-($OCH_2CH_2$)n-, (benzene ring)-($OCH(CH_3)CH_2$)n-, (benzene ring)-$OCH_2CH(OH)CH_2$)—, and (benzene ring)-$SCH_2CH_2$—. A specific example of the compound represented by the general formula (VI) is EO-modified tetrabromobisphenol A (meth)acrylate.

Another example of the compound (A) that does not belong to the compounds represented by the general formulas (III) to (VI) is furfuryl (meth)acrylate.

The above-mentioned photoradical polymerizable monomers may be used singly or in combination of two or more of them. According to the present invention, the refractive index of the photoradical polymerizable compound is, for example, preferably 1.50 or more, more preferably 1.55 or more in order to allow the photoradical polymerizable monomer (or polymer thereof) to serve as a high refractive index component. The upper limit of the refractive index is not particularly limited, but is about 1.70 or less. When two or more kinds of the photoradical polymerizable monomers are used in combination, the weighted average of their refractive indices may fall within the above range. It is to be noted that the refractive index is measured at 20° C. using the D-ray of sodium (n20/D).

As the photopolymerization initiator (B), one sensitive to the wavelength of recording light, that is, one that absorbs recording laser light and generates radicals is used. Examples of such a photopolymerization initiator include:
carbonyl compounds such as benzoin ethyl ether, benzophenone, and diethoxyacetophenone;
organotin compounds such as tributylbenzyltin;
alkylaryl borates such as tetrabutylammonium triphenylbutylborate and triphenyl-n-butylborate;
onium salts such as diphenyliodonium salts;
iron arene complexes such as
η5-cyclopentadienyl-η6-cumenyl-iron(1+)-hexafluorophosphate (1-);
trihalogenomethyl-substituted triazine compounds such as tris(trichloromethyl)triazine;
organic peroxides such as 3,3'-di(tert-butylperoxycarbonyl)-4,4'-di(methoxycarbonyl)b enzophenone, 3,3',4,4'-tetra(tert-butylperoxycarbonyl)benzophenone, di-tert-butylperoxyisophthalate, 2,5-dimethyl-2,5-bis(benzoylperoxy)hexane, and tert-butylperoxybenzoate; and
bisimidazole derivatives such as 2,2'-bis(o-chlorophenyl-4,4',5,5'-tetraphenyl-1,1'-bis-imidazole.

The photopolymerization initiator may be commercially available one such as Darocure 1173, Irgacure 784, Irgacure 651, Irgacure 184, Irgacure 907 (each manufactured by Ciba Specialty Chemicals), or BT-2 (manufactured by Chisso Corporation).

The above-mentioned photopolymerization initiators may be used singly or in combination of two or more of them. The amount of the photopolymerization initiator (B) contained in the hologram recording material composition is, for example, about 3 to 20% by weight, preferably about 3 to 10% by weight with respect to the amount of nonvolatile matter contained in the hologram recording material composition.

The hologram recording material composition may contain, in addition to the photopolymerization initiator, a dye that functions as a photosensitizer sensitive to the wavelength of recording light. Examples of such a photosensitizer include: thioxanthones such as thioxanthene-9-one and 2,4-diethyl-9H-thioxanthene-9-one; xanthenes; cyanines; merocyanines; thiazines; acridines; anthraquinones; and squaryliums. These photosensitizers may be used singly or in combination of two or more of them. The amount of the photosensitizer to be used is about 0.5 to 50% by weight, preferably about 0.5 to 10% by weight with respect to the amount of the photopolymerization initiator (B).

The dispersion medium (C) is used to disperse the photoradical polymerizable compound (A) and the photopolymerization initiator (B), and is selected from the group consisting of a compound represented by the general formula (I) and a compound represented by the general formula (II).

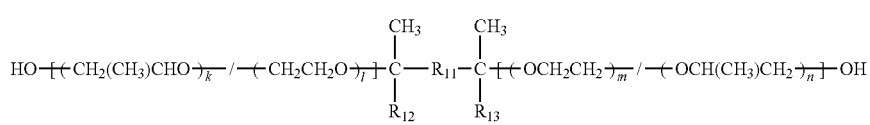

In the general formula (I), $R_{11}$ represents a divalent hydrocarbon group having 2 to 4 carbon atoms. Examples of the hydrocarbon group represented by $R_{11}$ include an acetylene unit (—C≡C—), a diacetylene unit (—C≡C—C≡C—), an ethylene unit (—CH=CH—), —CH$_2$CH$_2$—, and —CH$_2$CH$_2$CH$_2$CH$_2$—. Among them, an acetylene unit (—C≡C—) is preferred.

In the general formula (I), $R_{12}$ and $R_{13}$ may be the same or different and each represents a hydrocarbon group having 1 to 10 carbon atoms. Examples of the hydrocarbon group represented by $R_{12}$ and $R_{13}$ include aliphatic hydrocarbon groups such as a methyl group, an ethyl group, an n-propyl group, an isopropyl group, an n-butyl group, an isobutyl group, a sec-butyl group, a tert-butyl group, an n-pentyl group, an n-hexyl group, an isohexyl group, an octyl group, a 2-ethylhexyl group, and a decyl group.

In the general formula (I), l and m represent the number of repeating ethylene oxide units, k and n represent the number of repeating propylene oxide units, and k, l, m, and n are each independently a number of 0 or more and 5 or less. The ethylene oxide units and the propylene oxide units may be arranged in a random or block configuration. By increasing the number of repeating ethylene oxide units and/or the number of repeating propylene oxide units, the compound becomes more hydrophilic and its HLB (Hydrophile-Lipophile Balance) value increases.

Specific examples of the compounds represented by the general formula (I) include
2,4,7,9-tetramethyl-5-decyne-4,7-diol,
2,4,7,9-tetramethyl-5-decyne-4,7-diol ethoxylate (weight average molecular weight (Mw)=395, l=m=1.92), and
2,4,7,9-tetramethyl-5-decyne-4,7-diol ethoxylate (weight average molecular weight (Mw)=700, l=m=5.39).

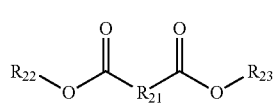

In the general formula (II), $R_{21}$ represents a divalent aliphatic hydrocarbon group having 1 to 6 carbon atoms. Examples of the hydrocarbon group represented by $R_{21}$ include: chain saturated hydrocarbon groups such as a methylene group [—CH$_2$—], an ethylene group [—(CH$_2$)$_2$—], a propylene group [—(CH$_2$)$_3$—], a butylene group [—(CH$_2$)$_4$—], a pentylene group [—(CH$_2$)$_5$—], and a hexylene group [—(CH$_2$)$_6$—]; and chain unsaturated hydrocarbon groups such as —CH=CH— (cis and trans) and —CH=C(CH$_3$)— (cis and trans).

In the general formula (II), $R_{22}$ and $R_{23}$ may be the same or different and each represents a hydrocarbon group having 1 to 12 carbon atoms, and at least one of $R_{22}$ and $R_{23}$ represents a hydrocarbon group having 5 to 12 carbon atoms. Examples of the hydrocarbon group represented by $R_{22}$ and $R_{23}$ include aliphatic hydrocarbon groups such as a methyl group, an ethyl group, an n-propyl group, an isopropyl group, an n-butyl group, an isobutyl group, a sec-butyl group, a tert-butyl group, an n-pentyl group, an n-hexyl group, an isohexyl group, an octyl group, a 2-ethylhexyl group, a decyl group, an undecyl group, and a dodecyl group.

Specific examples of the compounds represented by the general formula (II) include: saturated aliphatic dicarboxylic acid esters such as dipentyl malonate, dihexyl malonate, didodecyl succinate, bis(2-ethylhexyl) succinate, didodecyl glutarate, bis(2-ethylhexyl) adipate, didecyl adipate, and didodecyl suberate; and unsaturated aliphatic dicarboxylic acid esters such as bis(2-ethylhexyl) maleate, bis(2-ethylhexyl) fumarate, didodecyl citraconate, and didodecyl mesaconate.

The above-mentioned dispersion media may be used singly or in combination of two or more of them.

The refractive index of the dispersion medium is, for example, preferably 1.50 or less, more preferably less than 1.50. The lower limit of the refractive index is not particularly limited, but is about 1.40 or more. When two or more kinds of the dispersion media are used in combination, the weighted average of their refractive indices may fall within the above range. Further, in order to obtain a larger refractive-index modulation, the weighted average of refractive indices of the photoradical polymerizable monomers (A) to be used needs to be larger than that of refractive indices of the dispersion media (C) to be used.

The hologram recording material preferably further contains a binder polymer (D). The binder polymer (D) functions as a matrix in the hologram recording material.

As the binder polymer (D), a polymer that is compatible with all of the photoradical polymerizable monomer (A), the photopolymerization initiator (B), and the dispersion medium (C) and is soluble in an organic solvent is used. The term "polymer" is herein used as a concept also including prepolymers (low-molecular weight polymers having a low degree of polymerization).

Examples of the binder polymer (D) that can be used in the present invention include thermoplastic resins such as homopolymers of a monomer having an ethylenically unsaturated double bond, copolymers of said monomer and another monomer compolymerizable therewith, polymers obtained by condensation of diols with dicarboxylic acids, polymers of hydroxycarboxylic acids, and cellulose derivatives.

Specific examples of the thermoplastic resins include, but are not limited to, polyvinyl acetate, polyvinyl butyrate, polyvinyl formal, polyacrylic acid, polymethacrylic acid, polyacrylic or polymethacrylic acid esters, cellulose acetate, cellulose triacetate, cellulose acetate butyrate, polystyrene, polyethylene, polypropylene, and polyethylene-vinyl acetate copolymers.

A (meth)allyl group-containing compound is also preferably used as the binder polymer (D). As used herein, "(meth)

allyl group" is a collective term for a methallyl group (2-methyl-2-propenyl group) and an allyl group. Specific examples of the (meth)allyl group-containing compound include a prepolymer of tri(meth)allyl isocyanurate, a prepolymer of di(meth)allyl phthalate, and a prepolymer of di(meth)allyl isophthalate.

The radical polymerization reactivity of a (meth)allyl group is lower than that of a (meth)acryloyl group contained in the photoradical polymerizable monomer (A). Therefore, by adjusting the amount of light exposure at the time of light exposure for recording, it is possible to allow the polymerization reaction of the photoradical polymerizable monomer to proceed in bright portions while allowing the reaction of the (meth)allyl group-containing prepolymer (D) to hardly proceed. Then, the reaction between (meth)allyl groups is initiated by post light exposure after recording to convert the prepolymer to a polymer (three-dimensional polymer) having a higher degree of polymerization. This makes it easy to maintain the stability of the hologram recording material layer after recording.

Alternatively, a cationically-polymerizable group-containing compound may be used as the binder polymer (D). When a cationically-polymerizable group-containing compound is used, the same effect as that obtained by using the (meth)allyl group-containing compound is expected. For example, when an oxirane ring compound (epoxy or oxetane) is used as a cationically-polymerizable group-containing compound, it is possible, depending on the type of cationically-polymerizable group used, to allow the polymerization reaction of the photoradical polymerizable monomer to proceed in bright areas by exposure for recording without initiating the reaction between cationically-polymerizable groups, because the oxirane ring compound does not have polymerization activity to the photoradical polymerization initiator. After recording, the reaction between cationically-polymerizable groups is initiated by post-heating to convert the oxirane ring compound to a polymer, which is achieved by previously adding a thermal cationic polymerization initiator to the composition together with the photoradical polymerization initiator. This makes it easy to maintain the stability of the hologram recording material layer after recording.

The above-mentioned binder polymers may be used singly or in combination of two or more of them. As the binder polymer, a combination of a thermoplastic resin having no radical polymerization reactivity and a (meth)allyl group-containing compound may be used in an appropriate ratio.

The refractive index of the binder polymer is, for example, preferably 1.58 or less. The lower limit of the refractive index is not particularly limited, but is about 1.40 or more. When two or more kinds of the binder polymers are used in combination, the weighted average of their refractive indices may fall within the above range. Further, in order to obtain a larger refractive-index modulation, the weighted average of refractive indices of the photoradical polymerizable monomers (A) to be used needs to be larger than that of the refractive indices of the dispersion media (C) and the binder polymer (D) to be used.

The hologram recording material may further contain a plasticizer (E). The plasticizer (E) is different from any of the photoradical polymerizable compound (A), the photopolymerization initiator (B), the dispersion medium (C), and the binder polymer (D), and is non-reactive with any of them.

As the plasticizer (E), one used for producing a hologram recording material can be used. Examples of such a plasticizer include: phthalic acid esters such as dimethyl phthalate and diethyl phthalate; aliphatic dicarboxylic acid esters such as diethyl succinate, dimethyl adipate, diethyl adipate, dibutyl adipate, dimethyl sebacate, and diethyl sebacate; and acetic acid esters such as glyceryl triacetate and 2-ethylhexyl acetate. However, the aliphatic dicarboxylic acid esters are different from the compounds represented by the above general formula (II). The aliphatic dicarboxylic acid ester used as the plasticizer (E) is a compound represented by the general formula (II), where $R_{21}$ represents a divalent hydrocarbon group having 1 to 8 carbon atoms, $R_{22}$ and $R_{23}$ may be the same or different and each represents a hydrocarbon group having 1 to 4 carbon atoms. Among them, dimethyl sebacate and diethyl sebacate are preferred.

The above-mentioned plasticizers may be used singly or in combination of two or more of them. The use of the plasticizer (E) makes it easy to improve compatibility between the binder polymer and/or a polymer obtained by polymerization of the monomer at the time of recording; and the other components. However, the plasticizer (E) cannot be used in a large amount. This is because the use of a large amount of the plasticizer significantly reduces the viscosity of the recording material, which makes it difficult to maintain the shape of a recording layer. Further, the plasticizer remains as a liquid in the recording material layer even after recording, which causes a problem such as bleeding out of the plasticizer. Therefore, when the plasticizer (E) is used, the plasticizer is added in an amount described later.

The refractive index of the plasticizer is, for example, preferably 1.50 or less, more preferably less than 1.50. The lower limit of the refractive index is not particularly limited, but is about 1.40 or more. Further, in order to obtain a larger refractive-index modulation, the weighted average of refractive indices of the photoradical polymerizable monomers (A) to be used needs to be larger than that of refractive indices of the dispersion media (C), the binder polymer (D), and the plasticizer (E) to be used.

In the present invention, the blending ratio by weight of respective components in the hologram recording material is preferably:

10 to 70 parts by weight of the photoradical polymerizable compound (A);

3 to 20 parts by weight of the photopolymerization initiator (B);

5 to 30 parts by weight of the dispersion medium (C); and 20 to 80 parts by weight of the binder polymer (D).

And, the blending ratio is more preferably:

20 to 60 parts by weight of the photoradical polymerizable compound (A);

3 to 10 parts by weight of the photopolymerization initiator (B);

5 to 20 parts by weight of the dispersion medium (C); and 20 to 70 parts by weight of the binder polymer (D).

The dispersion medium (C) needs to be used in the amount described above to allow the photoradical polymerizable compound (A) to sufficiently diffuse and migrate at the time of light exposure for recording. If the amount of the dispersion medium (C) is less than 5 parts by weight, the effect on promoting the diffusion of the photoradical polymerizable compound (A) tends to be small. On the other hand, if the amount of the dispersion medium (C) exceeds 30 parts by weight, there is a fear that film handleability and signal stability after recording are lowered.

When the binder polymer (D) is not used, the blending ratio is preferably:

10 to 70 parts by weight of the photoradical polymerizable compound (A);

3 to 20 parts by weight of the photopolymerization initiator (B); and 25 to 80 parts by weight of the dispersion medium (C).

And, the blending ratio is more preferably:
20 to 60 parts by weight of the photoradical polymerizable compound (A);
3 to 10 parts by weight of the photopolymerization initiator (B); and
25 to 50 parts by weight of the dispersion medium (C).

When the plasticizer (E) is used, the amount of the plasticizer (E) to be used is, for example, about 3 to 80% by weight, preferably about 5 to 15% by weight with respect to the total parts by weight of the dispersion medium (C) and the binder polymer (D).

The hologram recording material according to the present invention can be produced as a uniform composition by mixing the respective components by any known mixing method. The thus obtained hologram recording material liquid is applied onto a substrate, for example, a resin transparent substrate such as a PET (polyethylene terephthalate) substrate, and is dried so that a hologram recording material layer is obtained as a film. In this way, a hologram recording material layer, in which the photoradical polymerizable compound is uniformly contained in the dispersion medium (if necessary, in the binder polymer as a matrix), is produced.

The hologram recording medium according to the present invention comprises a substrate and a hologram recording material layer formed on the substrate. The hologram recording medium may be formed to have a three-layer structure by further covering the hologram recording material layer with another substrate. The thickness of the hologram recording material layer is not particularly limited, and may be appropriately set according to the design of the recording medium. For example, the thickness of the hologram recording material layer may be set to about 5 to 500 μm.

The hologram recording medium to be produced is either of a medium having a structure for performing reproduction using transmitted light (a transmitted light reproducing type medium), and a medium having a structure for performing reproduction using reflected light (a reflected light reproducing type medium) in accordance with an optical system used for the medium.

When the recording material layer of the hologram recording medium is irradiated with coherent light, the photopolymerization initiator is cleaved in the exposed portion (bright portion), which triggers the polymerization reaction of the photoradical polymerizable compound (monomer) present near the photopolymerization initiator so that the photoradical polymerizable compound is polymerized. As a result, the concentration of the unreacted monomer is reduced in the bright portion so that a monomer concentration gradient is generated between the bright portion and the unexposed portion (dark portion). In order to compensate for the generated concentration gradient, the unreacted monomer diffuses and migrates from the dark portion to the bright portion so that the polymerization reaction of the monomer further proceeds in the bright portion. As a result, a large amount of polymer of the photopolymerizable monomer is present in the bright portion. When there is a refractive index difference between the photopolymerizable monomer (and polymer thereof) and the other components, a pattern in accordance with the bright and dark portions is recorded as a refractive index modulation (Δn).

The hologram recording material according to the present invention includes a compound having the above-described specific structure as a dispersion medium. This promotes the diffusion and migration of the photoradical polymerizable compound at the time of light exposure for recording so that high diffraction efficiency is achieved.

EXAMPLES

The present invention will be described more specifically with reference to the following examples, but is not limited to these examples.

Example 1

Preparation of Hologram Recording Medium Sample

A recording material composition solution having the composition shown in Table 1 was prepared in the following manner.

To 10 g of a vinyl acetate polymer (a 50 wt % methanol solution of vinyl acetate polymer manufactured by Wako Pure Chemical Industries, Ltd., number-average molecular weight Mn=1,400 to 1,600) as a matrix, 3 g of 9,9-bis[4-(2-acryloyloxyethoxy)phenyl]fluorene ("NK ester A-BPEF" manufactured by Shin-Nakamura Chemical Co., Ltd.) as a photopolymerizable monomer, 1.2 g of dihexyl malonate as a dispersion medium, and 0.4 g of diethyl sebacate as a plasticizer were added, and then, 2.4 g of a peroxide-based photopolymerization initiator ("BT-2" manufactured by Chisso Corporation, which is a 40% anisole solution of a mixture of 3,3'-di(tert-butylperoxycarbonyl)-4,4'-di(methoxycarbonyl) benzophenone and positional isomers thereof) was added thereto to obtain a mixture. Further, 6 g of an acetone solution (acetone 5.99 g), in which 10 mg of a sensitizing dye (3-butyl-2-[3-(3-butyl-5-phenyl-1,3-benzoxazole-2(3H)-ylidene) prop-1-en-1-yl]-5-phenyl-1,3-benzoxazole-1-ium=hexafluoro-λ5-phosphanuide, which is represented by the chemical formula (VII)) was dissolved, was added to and dissolved in the mixture by stirring to obtain a recording material composition solution.

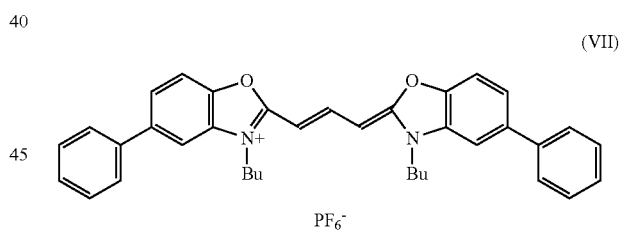

(VII)

The obtained recording material composition solution was applied onto a 100 μm-thick PET film using a bar coater, and was then dried at room temperature under reduced pressure overnight to form a recording material layer. The film thickness of the dried recording material layer was 20 μm. The PET film having the recording material layer formed thereon was attached to a 1.0 mm-thick slide glass so that the recording material layer was in contact with the glass surface to prepare a hologram recording medium sample.

(Characteristic Evaluation)

The characteristics of the hologram recording medium sample of Example 1 were evaluated in a hologram recording optical system shown in FIG. 1. The direction parallel to the sheet surface of paper on which FIG. 1 is drawn is defined as a horizontal direction for the sake of convenience.

In FIG. 1, the hologram recording medium sample (1) was set so that the recording material layer was perpendicular to the horizontal direction.

In the hologram recording optical system shown in FIG. 1, as a light source (11) for recording, an Nd:YAG laser (wavelength: 532 nm) was used. The hologram recording optical system was adjusted so that light emitted from the light source (11) was spatially filtered and collimated by means of a shutter (12), a convex lens (13), a pinhole (14), and a convex lens (15), and was allowed to travel through a mirror (16) and a ½ wavelength plate (17) to a beam splitter (18), and was split into two light beams by the beam splitter (18), and then one of the two split light beams was allowed to travel through a mirror (19) and an aperture (21) and the other split light beam was allowed to travel through a mirror (20) and an aperture (22) so that the two light beams vertically entered the recording material layer of the hologram recording medium sample (1) from opposite directions.

A reflection type hologram was recorded on the hologram recording medium sample (1) by the optical system under conditions where the light intensity was 30 mW/cm$^2$ and the exposure time was 5 seconds (150 mJ/cm$^2$). Then, the recording medium sample (1) was allowed to stand for 6 hours under a fluorescent lamp (27 W) (at a distance of 30 cm to the sample (1)) so that unreacted components were reacted and a color derived from the sensitizing dye was allowed to completely disappear (hereinafter, referred to as "post cure"). After the post cure, the recording medium sample was set in a spectrophotometer ("V-660" manufactured by JASCO Corporation) to measure a transmission spectrum. The diffraction efficiency of the reflection-type hologram was determined from a peak intensity determined from the transmission spectrum.

The diffraction efficiency was calculated by the following formula using a peak wavelength determined by processing software of the spectrophotometer, a transmittance Tp (%) at the peak, and a baseline transmittance T0 (%).

$$\text{Diffraction Efficiency}(\%) = [(T0-Tp)/T0] \times 100$$

The diffraction efficiency of the hologram recording medium sample of Example 1 was 85%.

Examples 2 to 19 and Comparative Examples 1 to 2

Hologram recording medium samples of Examples 2 to 19 and Comparative Examples 1 to 2 were prepared in the same manner as in Example 1 except that compounds shown in Tables 1 to 3 were used as the matrix, the photopolymerizable monomer, the dispersion medium, and the plasticizer in the composition shown in Tables 1 to 3, and the characteristics thereof were evaluated. The evaluation results of each of the hologram recording medium samples of Examples 2 to 19 and Comparative Examples 1 to 2 are shown in Tables 1 to 3.

[Description of Components Used]

TAIC prepolymer: prepolymer of triallyl isocyanurate (TAIC) (manufactured by Nippon Kasei Chemical Co., Ltd.)

2,4,7,9-tetramethyl-5-decyne-4,7-diol (manufactured by Sigma Aldrich, white solid, HLB=4)

2,4,7,9-tetramethyl-5-decyne-4,7-diol ethoxylate represented by the general formula (I) wherein l=m=1.92 (manufactured by Sigma Aldrich, weight average molecular weight Mw=395, pale yellow viscous liquid, HLB=8)

2,4,7,9-tetramethyl-5-decyne-4,7-diol ethoxylate represented by the general formula (I) wherein l=m=5.39 (manufactured by Sigma Aldrich, weight average molecular weight Mw=700, pale yellow viscous liquid, HLB=13)

It is to be noted that the blending amount (g) of each of the components mixed shown in Tables 1 to 3 is the amount of nonvolatile matter. For example, 10 g of the vinyl acetate polymer (50 wt % methanol solution) used in Example 1 corresponds to 5 g of nonvolatile matter.

Each of the hologram recording medium samples of Examples 1 to 19 used, as the dispersion medium, a compound having a specific molecular structure, which promoted the diffusion of the photoradical polymerizable monomer during recording and therefore high diffraction efficiency was achieved. On the other hand, each of the hologram recording medium samples of Comparative Examples 1 and 2 used only diethyl sebacate conventionally used as a plasticizer without using the dispersion medium, and therefore the monomer was not sufficiently diffused and the diffraction efficiency thereof was poor.

TABLE 1

| | | Example 1 | Example 2 | Example 3 | Example 4 | Example 5 | Example 6 | Example 7 |
|---|---|---|---|---|---|---|---|---|
| Matrix | vinyl acetate polymer (Mn = 1,400-1,600, 50 wt % methanol solution) | 5.0 g | 5.0 g | 5.0 g | 5.0 g | 5.0 g | 5.0 g | 5.0 g |
| | TAIC prepolymer | | | | | | | |
| Photopolymerizable monomer | A-BPEF | 3.0 g | 3.0 g | 3.0 g | 3.0 g | 3.0 g | 3.0 g | 3.0 g |
| Dispersion medium | dihexyl malonate | 1.2 g | | | | | | |
| | didodecyl succinate | | 1.2 g | | | | | |
| | bis(2-ethylhexyl) adipate | | | 1.2 g | | | | |
| | bis(2-ethylhexyl) fumarate | | | | 1.2 g | | | |
| | 2,4,7,9-tetramethyl-5-decyne-4,7-diol | | | | | 0.8 g | | |
| | 2,4,7,9-tetramethyl-5-decyne-4,7-diol ethoxylate (Mw = 395) | | | | | | 0.8 g | |
| | 2,4,7,9-tetramethyl-5-decyne-4,7-diol ethoxylate (Mw = 700) | | | | | | | 0.8 g |
| Plasticizer | diethyl sebacate | 0.4 g | 0.4 g | 0.4 g | 0.4 g | 0.8 g | 0.8 g | 0.8 g |
| Photopolymerization initiator | BT-2 (40 wt % anisole solution) | 0.96 g | 0.96 g | 0.96 g | 0.96 g | 0.96 g | 0.96 g | 0.96 g |
| Sensitizing dye | | 0.01 g | 0.01 g | 0.01 g | 0.01 g | 0.01 g | 0.01 g | 0.01 g |
| Diluent solvent | Acetone | 5.99 g | 5.99 g | 5.99 g | 5.99 g | 5.99 g | 5.99 g | 5.99 g |
| diffraction efficiency | | 85% | 87% | 95% | 91% | 93% | 90% | 83% |

TABLE 2

|  |  | Example 8 | Example 9 | Example 10 | Example 11 | Example 12 | Example 13 | Example 14 |
|---|---|---|---|---|---|---|---|---|
| Matrix | vinyl acetate polymer (Mn = 1,400-1,600, 50 wt % methanol solution) |  |  |  |  |  |  |  |
|  | TAIC prepolymer | 4.0 g | 4.0 g | 4.0 g | 4.0 g | 4.0 g | 4.0 g | 4.0 g |
| Photopolymerizable monomer | A-BPEF | 4.0 g | 4.0 g | 4.0 g | 4.0 g | 4.0 g | 4.0 g | 4.0 g |
| Dispersion medium | dihexyl malonate | 1.2 g |  |  |  |  |  |  |
|  | didodecyl succinate |  | 1.2 g |  |  |  |  |  |
|  | bis(2-ethylhexyl) adipate |  |  | 1.2 g |  |  |  |  |
|  | bis(2-ethylhexyl) fumarate |  |  |  | 1.2 g |  |  |  |
|  | 2,4,7,9-tetramethyl-5-decyne-4,7-diol |  |  |  |  | 0.8 g |  |  |
|  | 2,4,7,9-tetramethyl-5-decyne-4,7-diol ethoxylate (Mw = 395) |  |  |  |  |  | 0.8 g |  |
|  | 2,4,7,9-tetramethyl-5-decyne-4,7-diol ethoxylate (Mw = 700) |  |  |  |  |  |  | 0.8 g |
| Plasticizer | diethyl sebacate | 0.4 g | 0.4 g | 0.4 g | 0.4 g | 0.8 g | 0.8 g | 0.8 g |
| Photopolymerization initiator | BT-2 (40 wt % anisole solution) | 0.96 g | 0.96 g | 0.96 g | 0.96 g | 0.96 g | 0.96 g | 0.96 g |
| Sensitizing dye |  | 0.01 g | 0.01 g | 0.01 g | 0.01 g | 0.01 g | 0.01 g | 0.01 g |
| Diluent solvent | Acetone | 5.99 g | 5.99 g | 5.99 g | 5.99 g | 5.99 g | 5.99 g | 5.99 g |
| diffraction efficiency |  | 87% | 88% | 96% | 90% | 95% | 89% | 85% |

TABLE 3

|  |  | Example 15 | Example 16 | Example 17 | Example 18 | Example 19 | Comparative Example 1 | Comparative Example 2 |
|---|---|---|---|---|---|---|---|---|
| Matrix | vinyl acetate polymer (Mn = 1,400-1,600, 50 wt % methanol solution) | 5.0 g | 5.0 g | 5.0 g | 5.0 g | 5.0 g | 5.0 g |  |
|  | TAIC prepolymer |  |  |  |  |  |  | 4.0 g |
| Photopolymerizable monomer | A-BPEF | 3.0 g | 3.0 g | 1.5 g | 1.5 g | 1.5 g | 3.0 g | 4.0 g |
|  | 2,4,6-tribromophenyl acrylate |  |  | 1.5 g |  |  |  |  |
|  | EO-modified tetrabromobisphenol A methacrylate |  |  |  | 1.5 g |  |  |  |
|  | 2-(9-carbazolyl)ethyl metacrylate |  |  |  |  | 1.5 g |  |  |
| Dispersion medium | dihexyl malonate | 1.6 g |  | 1.2 g |  |  |  |  |
|  | didodecyl succinate |  |  |  |  |  |  |  |
|  | bis(2-ethylhexyl) adipate |  |  |  |  |  |  |  |
|  | bis(2-ethylhexyl) fumarate |  | 1.6 g |  | 1.2 g |  |  |  |
|  | 2,4,7,9-tetramethyl-5-decyne-4,7-diol |  |  |  |  | 0.8 g |  |  |
|  | 2,4,7,9-tetramethyl-5-decyne-4,7-diol ethoxylate (Mw = 395) |  |  |  |  |  |  |  |
|  | 2,4,7,9-tetramethyl-5-decyne-4,7-diol ethoxylate (Mw = 700) |  |  |  |  |  |  |  |
| Plasticizer | diethyl sebacate |  |  | 0.4 g | 0.4 g | 0.8 g | 1.6 g | 1.6 g |
| Photopolymerization initiator | BT-2 (40 wt % anisole solution) | 0.96 g | 0.96 g | 0.96 g | 0.96 g | 0.96 g | 0.96 g | 0.96 g |
| Sensitizing dye |  | 0.01 g | 0.01 g | 0.01 g | 0.01 g | 0.01 g | 0.01 g | 0.01 g |
| Diluent solvent | Acetone | 5.99 g | 5.99 g | 5.99 g | 5.99 g | 5.99 g | 5.99 g | 5.99 g |
| diffraction efficiency |  | 88% | 89% | 91% | 90% | 85% | 55% | 62% |

What is claimed is:

1. A volume hologram recording material, comprising:

from 10 to 70 parts by weight of a photoradical polymerizable compound, from 3 to 20 parts by weight of a photopolymerization initiator, and from 25 to 80 parts by weight of a dispersion medium, wherein the photoradical polymerizable compound is a compound comprising an aromatic ring and a (meth)acryloyl group in each molecule, and the dispersion medium is a medium capable of dispersing the photoradical polymerizable compound and the photopolymerization initiator and is of formula (I):

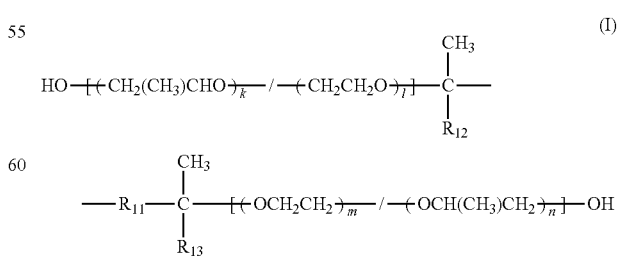

wherein $R_{11}$ is a divalent hydrocarbon group having from 2 to 4 carbon atoms, $R_{12}$ and $R_{13}$ are each independently a hydrocarbon group having from 1 to 10 carbon atoms, k, l, m, and n are each independently a number of 0 or more and 5 or less, and if both ethylene oxide units and propylene oxide units are present in the compound of formula (I), then the ethylene oxide units and the propylene oxide units are in a random or block configuration.

2. The hologram recording material according to claim 1, wherein $R_{11}$ is a divalent acetylene unit (—C≡C—).

3. The hologram recording material according to claim 1, wherein the photoradical polymerizable compound comprises a compound selected from the group consisting of:

a compound of formula (III):

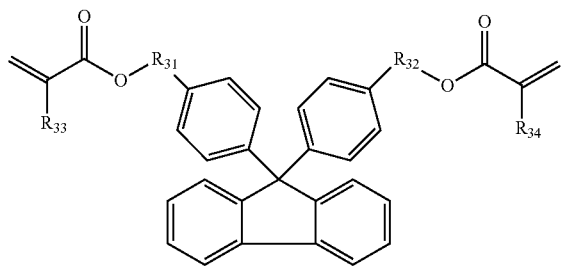

(III)

wherein $R_{31}$ and $R_{32}$ are each independently a (benzene ring)-OCH$_2$CH$_2$— group or a (benzene ring)-OCH$_2$CH(OH)CH$_2$— group, and $R_{33}$ and $R_{34}$ are each independently a hydrogen atom or a methyl group;

a compound of formula (IV):

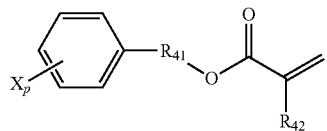

(IV)

wherein $R_{41}$ is a single bond or a divalent organic group which has 5 or fewer carbon atoms and optionally a heteroatom, $R_{42}$ is a hydrogen atom or a methyl group, X is a Cl, Br, or I atom, and p is an integer of 0 to 5;

a compound of formula (V):

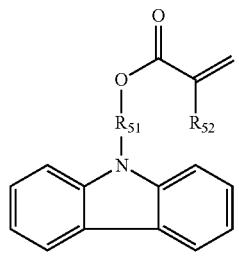

(V)

wherein $R_{51}$ is a divalent organic group which has 5 or fewer carbon atoms and may have a heteroatom, and $R_{52}$ is a hydrogen atom or a methyl group; and a compound of formula (VI):

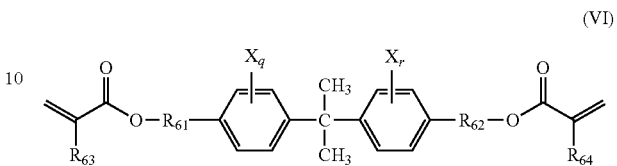

(VI)

wherein $R_{61}$ and $R_{62}$ are each independently a divalent organic group which has 10 or fewer carbon atoms and may have a heteroatom, $R_{63}$ and $R_{64}$ are each independently a hydrogen atom or a methyl group, X is a Cl, Br, or I atom, and q and r are each independently an integer of 0 to 4.

4. The hologram recording material according to claim 1, wherein the photoradical polymerizable compound, the photopolymerization initiator, and the dispersion medium are blended in a weight ratio of:

from 20 to 60 parts by weight of the photoradical polymerizable compound;

from 3 to 10 parts by weight of the photopolymerization initiator; and from 25 to 50 parts by weight of the dispersion medium.

5. A volume hologram recording medium, which comprises:

a substrate, and a hologram recording layer comprising the hologram recording material according to claim 1 on the substrate, wherein the hologram recording medium is suitable for image recording.

6. The hologram recording material of claim 1, further comprising a plasticizer.

7. A volume hologram recording material, comprising:

from 10 to 70 parts by weight of a photoradical polymerizable compound, from 3 to 20 parts by weight of a photopolymerization initiator, from 5 to 30 parts by weight of a dispersion medium, and from 20 to 80 parts by weight of a binder polymer, wherein the photoradical polymerizable compound is a compound comprising an aromatic ring and a (meth)acryloyl group in each molecule, and the dispersion medium is a medium capable of dispersing the photoradical polymerizable compound and the photopolymerization initiator and is of formula (I):

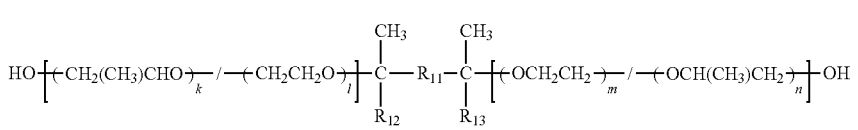

(I)

wherein $R_{11}$ is a divalent hydrocarbon group having from 2 to 4 carbon atoms, $R_{12}$ and $R_{13}$ are each independently a hydrocarbon group having from 1 to 10 carbon atoms, k, l, m, and n are each independently a number of 0 or more and 5 or less, and if both ethylene oxide units and propylene oxide units are present in the compound of formula (I), then the ethylene oxide units and the propylene oxide units are in a random or block configuration.

8. The hologram recording material according to claim 7, wherein at least a part of the binder polymer is a (meth)allyl group-containing compound.

9. The hologram recording material according to claim 7, wherein the photoradical polymerizable compound, the photopolymerization initiator, the dispersion medium, and the binder polymer are blended in a weight ratio of:

from 20 to 60 parts by weight of the photoradical polymerizable compound;

from 3 to 10 parts by weight of the photopolymerization initiator;

from 5 to 20 parts by weight of the dispersion medium; and from 20 to 70 parts by weight of the binder polymer.

10. The hologram recording material of claim 7, further comprising a plasticizer.

* * * * *